(12) United States Patent
Har et al.

(10) Patent No.: US 6,320,521 B1
(45) Date of Patent: Nov. 20, 2001

(54) SYSTEM AND METHOD FOR EFFICIENTLY MERGING COMPRESSED DATA

(75) Inventors: David Har, Briarcliff Manor; Kwok-Ken Mak, Wappingers Falls, both of NY (US); Charles O. Schulz, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/569,556

(22) Filed: May 12, 2000

(51) Int. Cl.[7] ................................................... H03M 7/00
(52) U.S. Cl. ............................................... 341/50; 341/51
(58) Field of Search ................................. 341/50, 51, 76

(56) References Cited

U.S. PATENT DOCUMENTS

| | | | |
|---|---|---|---|
| 4,049,917 | * | 9/1977 | Copperi et al. ......................... 341/76 |
| 5,729,228 | | 3/1998 | Franaszek et al. ..................... 341/51 |

* cited by examiner

*Primary Examiner*—Trong Phan
(74) *Attorney, Agent, or Firm*—Scully, Scott, Murphy & Presser; Robert P. Tassinari, Esq.

(57) ABSTRACT

A highly-efficient system and methodology for organizing, storing and/or transmitting compressed data that achieves optimum compression throughput, enhances overall data compressibility, and reduces decompression latency.

13 Claims, 4 Drawing Sheets

SYSTEM AND METHOD FOR EFFICIENTLY MERGING COMPRESSED DATA

BACKGROUND OF THE INVENTION

1. Field of the Invention

This invention relates generally to the field of data compression systems, and more specifically to an improved method and format for organizing, storing and transmitting compressed data.

2. Discussion of the Prior Art

Data compression has become increasingly vital in today's computer systems due to the high demand for data transmission and storage capacity. In particular, main memory compression is now both feasible and desirable with the advent of parallel compression using a cooperative dictionary, as described in commonly-owned U.S. Pat. No. 5,729,228 to Franaszek et al. entitled PARALLEL COMPRESSION AND DECOMPRESSION USING A COOPERATIVE DICTIONARY, incorporated herein by reference. Parallel compression is a relatively new art in the field of compression. Its main concept is to divide a block of uncompressed data into multiple sectors and then assign them to individual engines for both compression and decompression with all engines sharing a cooperative dictionary such that the compression ratio is close to that of a single-engine design. This results in much better latency and throughput than the previous single-engine designs, thus making main memory compression feasible. It is the case however, that latency and throughput objectives may be better achieved provided there is implemented a highly-efficient compressed data format.

It would thus be highly desirable to provide a system and method for organizing compressed data efficiently, particularly, compressed data in parallel format, in order to enhance compression throughput and reduce decompression latency in data storage and data transmission systems.

SUMMARY OF THE INVENTION

It is an object of the invention to provide for a computer memory system implementing data compression, a highly-efficient compression output mechanism for organizing, storing and/or transmitting compressed data efficiently, particularly, by processing compressed data in parallel in order to enhance compression throughput and reduce decompression latency.

It is another object of the invention to provide a system and methodology for efficiently merging compressed data in a manner such that a compressor mechanism is enabled to write out parallel streams of compressed data from multiple compression engines quickly and with minimal loss of compression ratio.

Thus, according to the principles of the invention, there is provided a data compression system comprising: one or more compression engines executing in parallel for receiving uncompressed information words and compressing said information words into one or more compressed information words; a temporary storage queue associated with each compression engine for temporarily storing one or more compressed information words from its respective compression engine; a pre-fetch mechanism for pre-fetching an amount of compressed information words in parallel from each said temporary storage queue; a first processing device for receiving said pre-fetched compressed information words and successively forming a merged word in queue sequence order for output each processing cycle; and, a second processing device for receiving said pre-fetched compressed information words and generating a number of consecutive next available compressed words in queue sequence order when one or more temporary storage queues have exhausted its storage of compressed information words at any time during a processing cycle and, at such time, utilizing said number of consecutive next available compressed words to form said merged word output, whereby output of a complete merged word in each successive cycle is ensured.

Advantageously, the compressed data format enables a compressor to write out parallel streams of compressed data from multiple engines quickly and facilitates a decompression engine to extract the individual streams of compressed data easily without separate data delimiters and control. Thus, not only are the advantages of parallel processing with the compression and decompression engines exploited, but also the advantages of enhanced compression throughput and reduced decompression latency.

BRIEF DESCRIPTION OF THE DRAWINGS

Further features, aspects and advantages of the apparatus and methods of the present invention will become better understood with regard to the following description, appended claims, and accompanying drawings where:

DETAILED DESCRIPTION OF THE PREFERRED EMBODIMENT

The present invention is related to a system and methodology for organizing and storing compressed data efficiently according to the data format described in commonly-owned, co-pending U.S. patent application Ser. No. 09/569,557 entitled HIGHLY EFFICIENT COMPRESSION DATA FORMAT the contents and disclosure of which is incorporated by reference.

Figure 1:
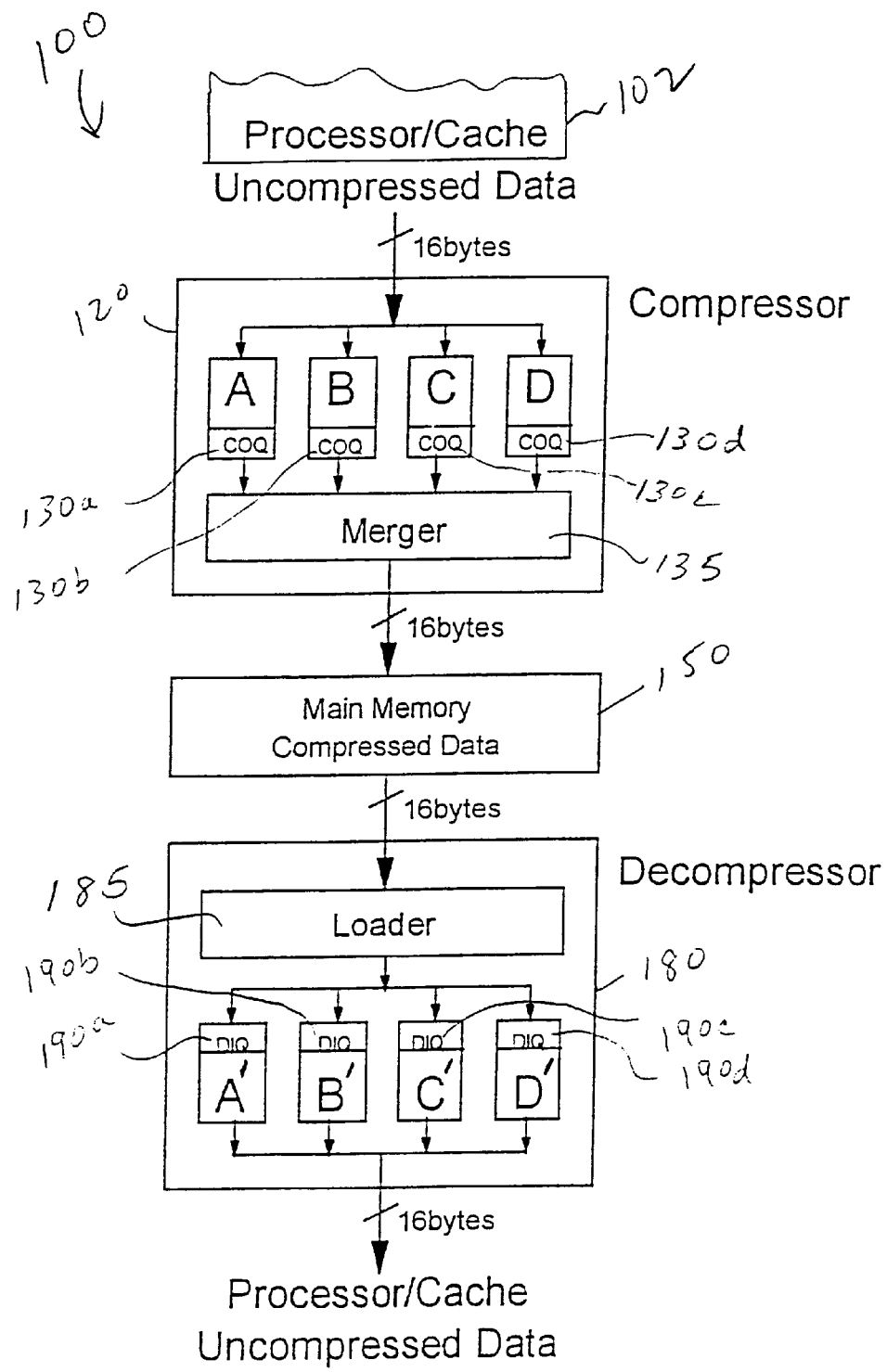
FIG. 1 depicts generally a block diagram of the main memory system of the invention including hardware compressor and decompressor mechanisms.

Referring to FIG. 1, there is depicted a block diagram of a computer system 100 shown including compressor 120, a main memory 150 and decompressor 180 components. In a conventional application, the compressor mechanism 120 converts uncompressed input data received from a processor and/or cache memory component 102 and stores the resulting compressed data in the main memory 150. Subsequently, the decompressor component 180 retrieves the compressed data and converts it back to the original uncompressed data for use in the processor/cache 102. In general, the compressor 120 may comprise two or more parallel, identical engines and, in the embodiment depicted in FIG. 1, it includes four parallel, identical engines indicated as compressor engines labeled A,B,C and D. In the example system depicted in FIG. 1, each block of uncompressed input data, for example, may total 1 Kbyte, which may be divided into four 256-byte sectors, however, it is understood that uncompressed input data may be any multiple byte length, e.g., 512 bytes. During compression, each engine A,B,C and D processes a different (256-byte) sector in parallel, and saves the resultant compressed data in its own corresponding output queue (COQ) 130a,b, . . . ,d. As each sector's compressibility will vary, the amount of compressed data in each queue may be different. It should be understood that each of the COQs 130a,b, . . . ,d are deep enough to hold even an uncompressible sector. If the total number of compressed data bits is not a multiple of 32, i.e., at a word boundary, then the last compressed word is padded with 0's. As further shown in FIG. 1, the compressor 120 further includes an output merger stage 135 implementing functionality for collecting 4-byte-wide compressed data words from each engine's COQ 130a,b, . . . ,d, and combining them into 16-byte-wide quadwords, for output to the main memory component 150.

Figure 2:
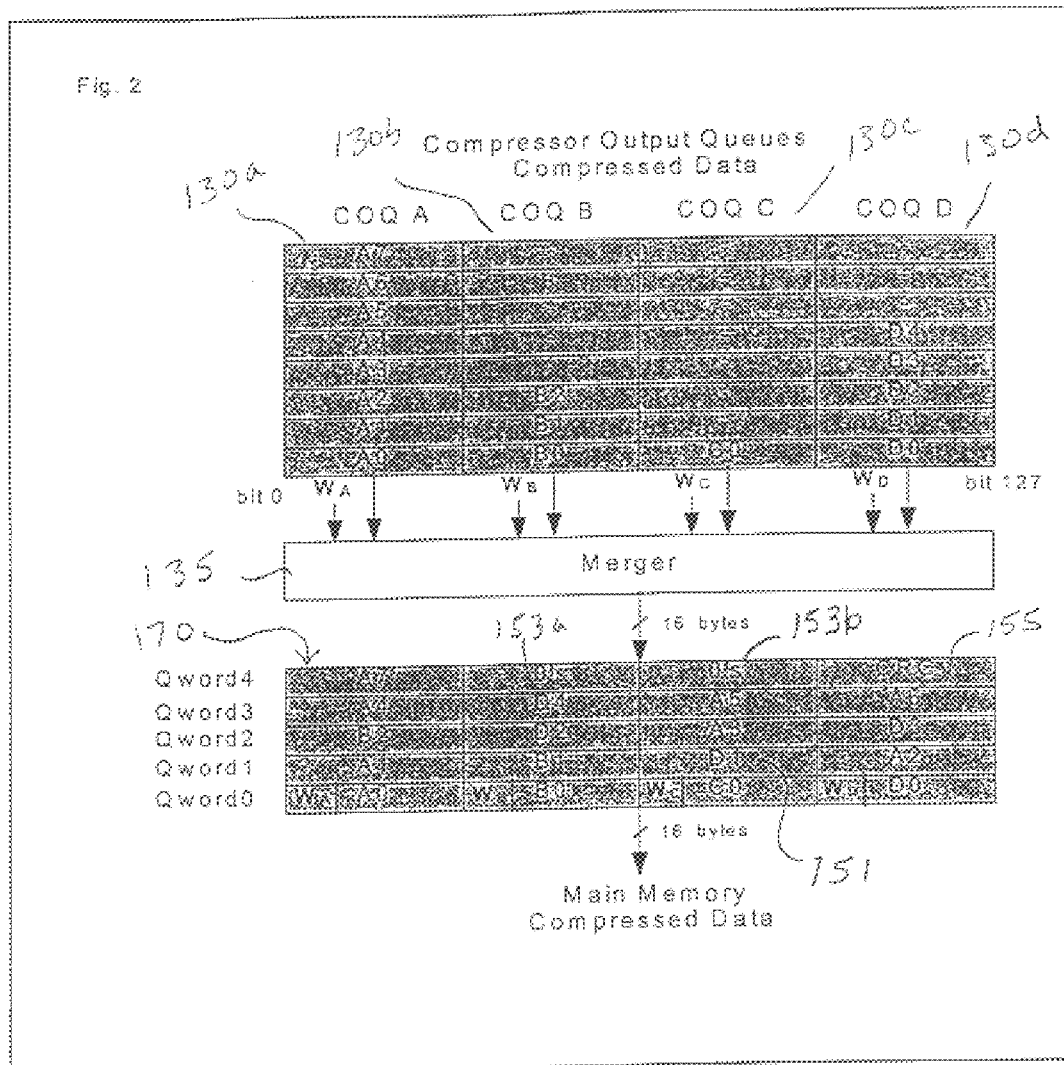
FIG. 2 illustrates an example format for compressing information according to the principals of the present invention. the compressed data format implemented in the present invention.

FIG. 2 illustrates an example of how the merger stage 135 organizes the compressed data words efficiently according to the format disclosed hereafter. In the example depicted, Engine A's COQ 130a, includes compressed data words A0 through A7; Engine B's COQ 130b includes compressed data words B0 through B2, Engine C's COQ 130c includes compressed data words C0 and, Engine D's COQ 130d includes compressed data words D0 through D4. The first compressed word of each COQ, namely words A0, B0, C0 and D0, also includes a respective byte-wide word count field '$W_A$', '$W_B$', '$W_C$' and '$W_D$' in its most significant byte position, i.e. bits 0 through 7 with each word count field indicating the number of remaining compressed data words for the respective engine. For example, the remaining word count, $W_A$, of COQ A 130a, is 0x07 and for COQ C 130c the word count field $W_C$ is 0x00. The very first compressed data bits following the word count field starts at bit 8.

At the start of compression output 170, all four COQs 130a,b, . . . ,d, contribute a compressed data word to the merger stage 135 to form the first quadword (A0, B0, C0, D0). Subsequent quadwords will contain compressed data words in the same queue order. When a COQ has exhausted all its compressed data words, it drops out of the output rotation and its corresponding word slot is filled by the next COQ in sequence. For example, as shown in FIG. 2, the merger stage output at quadword (Qword 1) entry 151 indicates the absence of compressed data for the output queue COQ 130c corresponding to engine c, resulting in the insertion of the next successive quadword D1 from the next output queue COQ D 130d. When all the queues have exhausted their compressed data words, the last quadword will be filled with zeros (0) as shown in quadword (Qword 4) entries 153a and 153b. Furthermore, a 4-byte cyclic redundancy code (CRC) 155 will then be embedded into the least significant word position of the last quadword, i.e., bits 96 to 127. If there is not enough room in the last quadword, then a new quadword will be appended for storing the CRC. This CRC is generated from the original uncompressed 1 Kbyte input data and is to be used by the decompressor to verify the integrity of the compressed data.

Referring back to FIG. 1, there is illustrated a decompressor mechanism 180 including an input "loader" stage 185 having functionality for retrieving the compressed data from the main memory and distributing the data to a corresponding decompressor input queue (DIQ) 190a,b, . . . ,d associated with a respective parallel decompressor engines A', B', C', and D'. The DIQs 190a,b, . . . ,d are used as FIFOs for the incoming compressed data words before the latter are processed by the respective engines A', B', C', and D'. The number of decompressor input queues 190a,b, . . . ,d and corresponding engines A', B', C', and D' are the same as those in the compressor, e.g., four engines in the example depicted. In each engine, compressed data words are first stored in its own DIQ. Given that the compressed data is stored in the main memory using the format disclosed in this invention, it becomes a relatively simple task for the loader 185 to quickly distribute the data to the DIQs for decompression. This, in turns, lowers the decompression latency significantly.

Specifically, at the beginning of decompression, the loader 185 always reads in the first quadword from the main memory. This quadword contains the individual word count '$W_A$, $W_B$, $W_C$, $W_D$' for each engine. The loader uses the word counts to determine how many more quadwords to retrieve and how to distribute the compressed data words. Initially, it always distributes the compressed data words to the engines in sequence, i.e., A0, B0, C0, D0, etc. When the word count for a particular engine has been exhausted, the loader will skip this engine from then on. For example, in FIG. 2, Engine C's word count $W_C$ is 0. Thus, it drops out of the rotation after the first quadword. Eventually, only Engine A has compressed data words in quadwords Qword 3 and Qword 4.

As the compressed data has been stored in an optimum format according to the invention, the decompressor's engines A', B', C', and D' are able to start decompressing the data immediately and simultaneously. This contributes to the low latency as desired for decompression.

Figure 3:
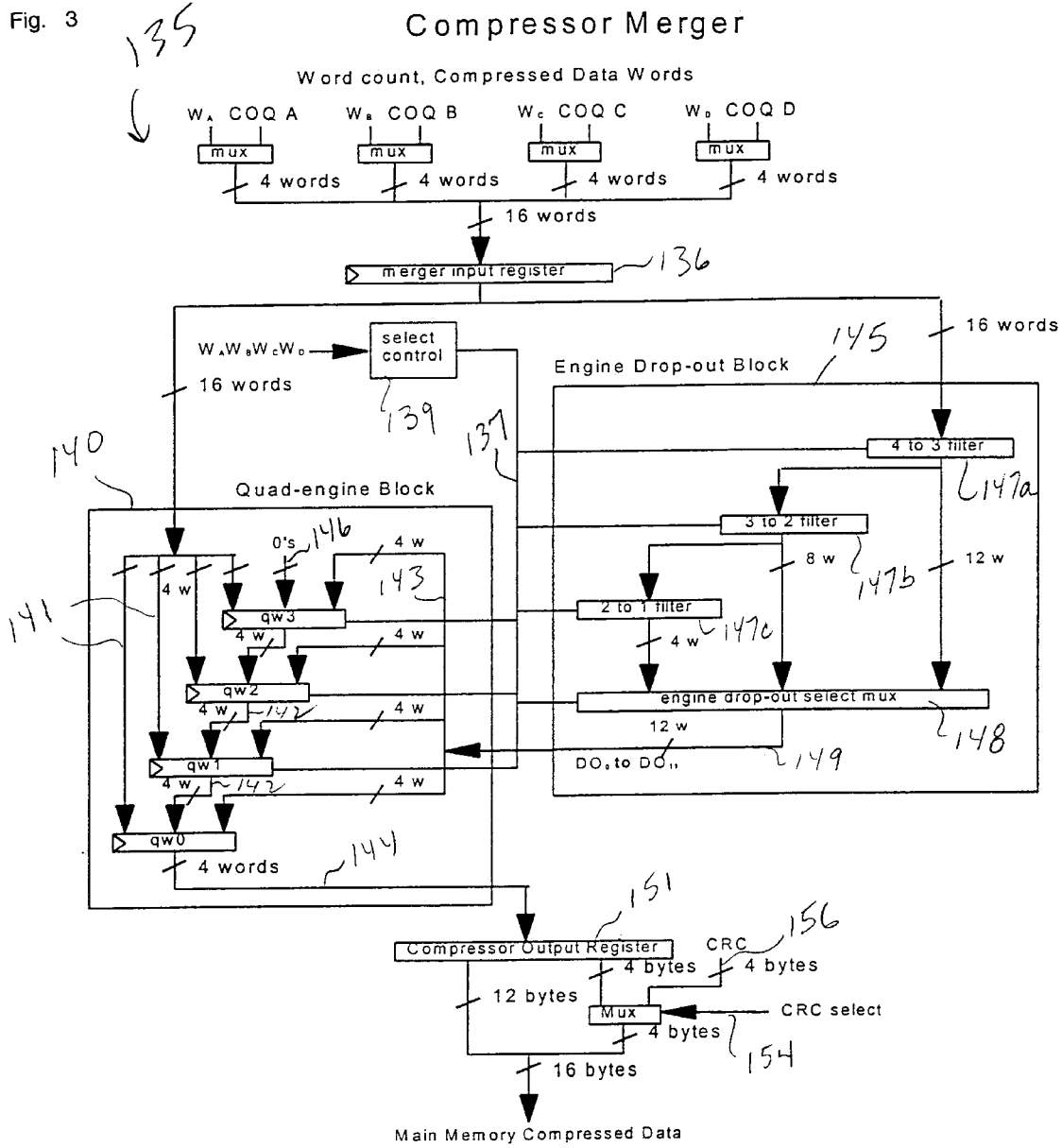
FIG. 3 illustrates a block diagram of the compression output mechanism, namely the merger device.

FIG. 3 is a detailed illustration of the merger stage 135. As shown, the merger stage 135 comprises two logic blocks, namely the quad-engine block 140 and the engine drop-out block 145. From the start of the merger output process, these two blocks 140, 145 work together cycle-by-cycle to generate the compressed data output according to the aforementioned compressed data format. Each block 140,145 comprises internal multiplexers and registers that work together to generate the compressed data output according to the aforementioned compressed data format. These internal multiplexers and registers are controlled by a select control logic block 139 which receives as input each remaining word counts, $W_A$, $W_B$, $W_C$, and $W_D$ from the respective four engines, and generates a set of select lines 137 for controlling internal multiplexers and registers. These select lines 137 determines which input compressed words will be outputted and what order they should have. The select control logic block 139 additionally detects if an engine has dropped-out.

More particularly, the select control logic block 139 first loads the four engines' remaining word counts, $W_A$, $W_B$, $W_C$, and $W_D$ into its internal registers. Then it uses them to generate a set of select lines 137 in subsequent cycles. These select lines determine which input compressed words will be outputted from the quad-engine block 140 and the engine drop-out block 145. As will be explained in greater detail, during each cycle in the output process each remaining word count will be decremented for each corresponding word outputted. In this manner, both blocks may track compressed data content to check for any engine drop-out.

In order to sustain a throughput of four compressed data words (16 bytes) per output cycle, the merger device 135 must pre-fetch four consecutive compressed data words from each respective COQ A–COQ D into its 16-word-wide merger input register 136 each cycle and then forward them to the two logic blocks 140, 145. Specifically, the sixteen compressed words are $A_n A_{n+1} A_{n+2} A_{n+3} B_n B_{n+1} B_{n+2} B_{n+3} C_n C_{n+1} C_{n+2} C_{n+3} D_n D_{n+1} D_{n+2} D_{n+3}$ where n is a whole number integer greater than or equal to 0. This is necessary because if one or more engines have exhausted their data, then the merger must use additional words from the remaining engines during the same cycle. For example, if engine C drops out, then two words are needed from engine A to form the output data, i.e., $A_n B_n D_n A_{n+1}$. If only engine B has remaining data in its COQ, then four words are needed from engine B to form the output data, i.e., $B_n B_{n+1} B_{n+2} B_{n+3}$.

More specifically, the quad-engine block 140 is the main logic block in the merger. It comprises four 4-word-wide pipeline registers labeled qw0, qw1, qw2, and qw3. Each register may select from three types of inputs: 1) direct 141; 2) pipeline 142; or 3) drop-out 143, with only register q3 not receiving a pipeline input. Firstly, direct inputs 141 receive compressed words directly from the merger input register 136 with one word from each engine being clocked into each register. For example, the four words $A_0$, $B_0$, $C_0$, and $D_0$ from the merger input register 136 are clocked into register qw0 and in the same cycle, the four words, $A_1$, $B_1$, $C_1$, and $D_1$ are clocked into register qw1, and so on for the remaining registers. Secondly, the pipeline input 142 receives the four word inputs from the previous pipe stage. For example, the four word outputs 142 of registers qw1, qw2, and qw3 sources to the pipeline input of registers qw0, qw1, and qw2, respectively. Furthermore, the last pipeline input of register qw3 may be tied to zeros (0) as shown at input 146. As shown in FIG. 3, only the output 144 of register qw0 is input to the compressor output register 151 which becomes the output of the merger in each cycle. Thirdly, when an engine A, B, C, D has exhausted its data in its respective COQ, its remaining word count $W_A$, $W_B$, $W_C$, and $W_D$ will become zero. That engine drops out and remains on the sideline for the rest of the output phase with no further data contribution. All subsequent merger output will come from the engine drop-out block 145 via the drop-out inputs 143 of the pipeline registers.

The main function of the engine drop-out block 145 is to offload some of the output selection cases from the quad-engine block so that the latter can achieve an optimal throughput. Specifically, the engine drop-out block must handle cases when one or more engines have dropped out at any time during the output process. Given that an engine may contribute from zero to four words during each read of the COQs, the engine drop-out block must generate consecutive compressed words according to the aforementioned compressed data format. Specifically, it utilizes three sets of filters 147a, 147b, 147c in series along with the select lines 137 from the select control logic block 139. As shown in FIG. 3, the 4-to-3 filter 147a handles the case when only one engine has dropped out. Specifically, it receives four compressed words from all four engines (16 words) and produces a twelve-word output after determining which engine has dropped out. For example, if engine C has dropped out, then the data output of filter 147a will be $A_0 B_0 D_0 A_1 B_1 D_1 A_2 B_2 D_2 A_3 B_3 D_3$ (12 words). Similarly, if two engines have dropped out, then the 3-to-2 filter 147b receives the four compressed words from the three remaining engines output from the 4-to-3 filter 147a, and produces an eight-word output after determining which second engine has dropped out. For example, if, besides engine C, engine A has also dropped out, then the filter data output will be $B_0 D_0 B_1 D_1 B_2 D_2 B_3 D_3$. Thirdly, if three engines have dropped out, then the 2-to-1 filter 147c will also be employed along with the previous two filters for taking the four compressed words from the two remaining engines output from the 3-to-2 filter 147b and produces a four-word output after determining which third engine has dropped out. For example, if, besides engines A and C, engine D has also dropped out, then the filter data output will be $B_0 B_1 B_2 B_3$.

Given all the possible cases of dropped-out engines, the select control logic block 139 then selects from the three filters' outputs using the engine drop-out select multiplexor 148 (FIG. 3) to generate output 149 comprising the twelve (12) consecutive compressed data words, $DO_0$ to $DO_{11}$ at the end of the cycle.

Figure 4:
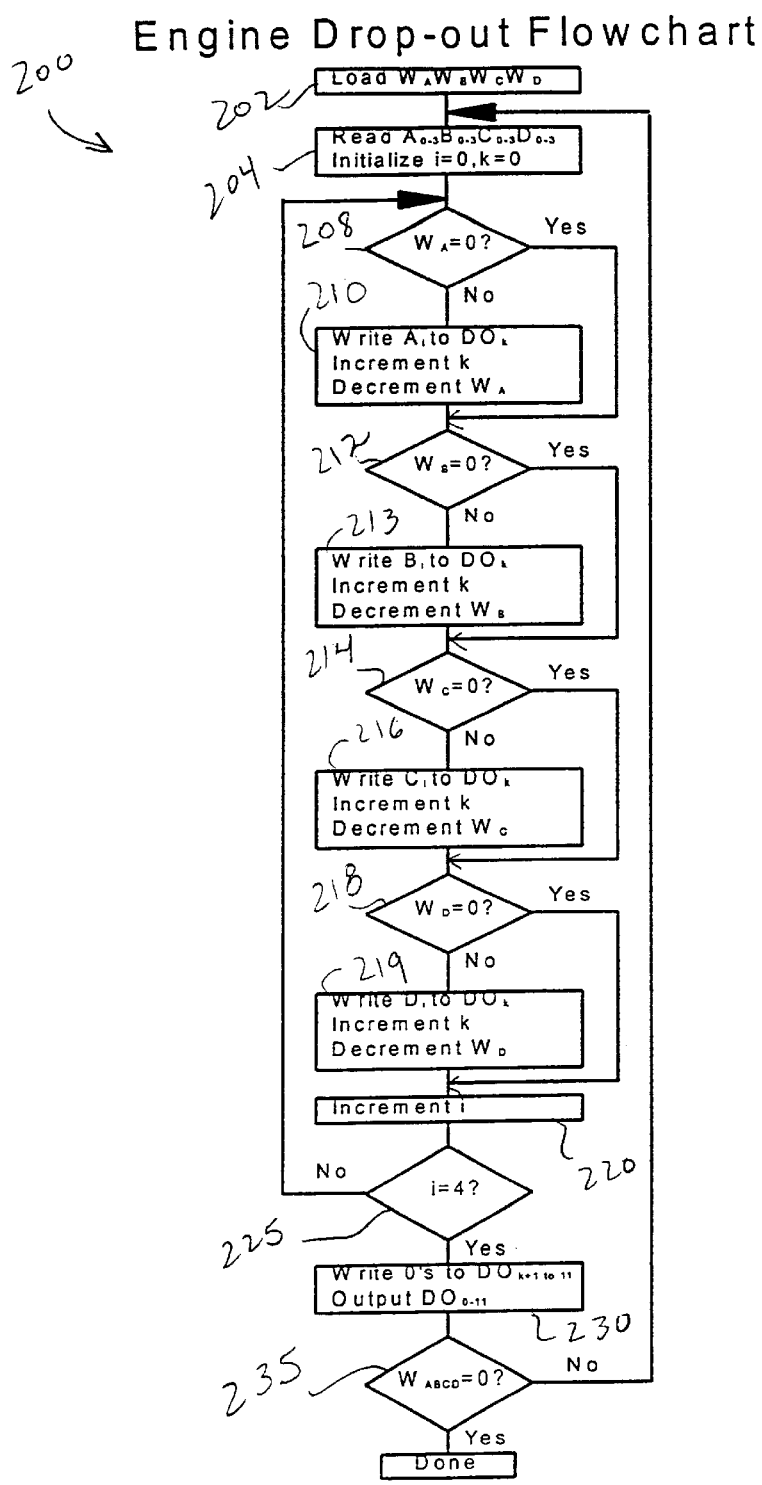
FIG. 4 is a flowchart depicting the methodology employed by the engine drop-out block of the compression output merger mechanism illustrated in FIG. 3.

FIG. 4 is a flowchart 200 depicting the methodology employed by the engine drop-out block for generating the 12 word output. It is understood that, from the start of the merger output process, drop-out block 145 functions with the quad-engine block 140 synchronously. Given that the remaining word counts $W_A$, $W_B$, $W_C$, $W_D$ for each engine have been pre-loaded by the select control logic block 139 as indicated at step 202, the engine drop-out block proceeds in accordance with the logic depicted in FIG. 4. Generally, the logic depicted in FIG. 4 requires that, during each cycle, the engine drop-out block check each word count in alphabetical order. If a word count is non-zero, then it will be decremented and its corresponding compressed data word will be selected as the next most significant word of DO. Otherwise, that engine has dropped out and the engine drop-out block moves on to the next word count. After all four word counts have been checked four times, the engine drop-out block has completed one pass.

FIG. 4 is now described in more detail as follows: The individual word counts $W_A$, $W_B$, $W_C$, $W_D$ for each engine are first loaded at step 202, and the 16 words, e.g., $A_{0-3} B_{0-3} C_{0-3} D_{0-3}$ (four from each queue) are read at step 204. Additionally, index variables i,k are initialized. Then the engine checks each word count in alphabetical order. For example, at step 208, a determination is made as to whether the engine A has dropped out, i.e., word count $W_A=0$. If the engine has not dropped out, the respective word loaded word $A_i$ for engine A is written to the output $DO_i$ 149, the variable k is incremented, and the respective word count $W_A$ is decremented as indicated at step 210. Otherwise, if, at step 208, it was determined that the engine A has dropped out, i.e., word count $W_A=0$, then the process proceeds to determine the status of the word counts for the remaining engines. That is, the process of checking the word count (steps 212, 214 and 218) and processing the next loaded word if the corresponding engine has not dropped out (steps 213, 216 and 219) is repeated for each of the remaining engines B, C, D. For each remaining respective engine B, C, D that has not dropped out as indicated by an individual word count $W_B$, $W_C$, $W_D$ being not equal to zero (0) (steps 212, 214, 218), the engine drop-out block will decrement the respective word count and that engine's corresponding compressed data word will be selected as the next most significant word of $DO_i$ and written to the output 149 in the cycle, as indicated at steps 213, 216 and 219, respectively. Otherwise, that engine has dropped out and the engine drop-out block moves on to the next word count. After all four word counts have been checked the index i is incremented at step 220 and the process steps 208–220 are repeated for four times, as indicated by the determination of i=4 at step 225.

During this process, if no engine has dropped out, then the engine drop-out block's output 149 will be ignored by the quad-engine block 140 which utilizes its direct and pipeline inputs instead for outputting each four compressed words each cycle. If one engine has dropped out, then the twelve (12) words of DO will be used by the quad-engine block 140. For example, if engine C has dropped out, then the filter data output will be $A_0 B_0 D_0 A_1 B_1 D_1 A_2 B_2 D_2 A_3 B_3 D_3$. If there are two or more engines dropped out, such that there are fewer than twelve 12 valid compressed data words from the filters, then the output will be back-filled with zero's as indicated at step 230. For example, if, besides engine C, engine A has also dropped out, then the filter data output will be $B_0D_0B_1D_1B_2D_2B_3D_3$ followed by four words of zero. These data are then sent to the different pipeline registers in the quad-engine block 140 for output. That is, $DO_{0-3}$ will be used by qw0, $DO_{4-7}$ will be used by qw1, etc.

All of the above filtering and data selection takes place in parallel within one single cycle. At the end of each cycle, if the sum of the four word count is still non-zero, then the engine drop-out block 145 repeats the previous steps and produces a new 12-word output in the following cycle. When there is only one remaining engine, then each 12-word output consists of only four valid words from that engine followed by eight words of zero. The ability of the engine drop-out block to output 12 words per cycle is important because it sustains the throughput requirement of the merger, which is four compressed data words per cycle. As shown in FIG. 4, at step 235, when the sum of the four word count is zero, the control signal CRC select 154 will become active and cause the mux 148 to select the CRC 156 for output. This CRC is generated from the original uncompressed 1 Kbyte input data and is to be used by the decompressor to verify the integrity of the compressed data.

In summary, at the start of compression output process, the merger stage 135 first reads quadwords from all four engines' COQs into the merger input register 142. It then loads them into the four pipeline registers accordingly. $A_0$, $B_0$, $C_0$, and $D_0$ will be clocked into register qw0 while $A_1$, $B_1$, $C_1$, and $D_1$ will be loaded directly into register qw1, and so forth. During the next four cycles, each pipeline register will send its 4-word data to the next stage and eventually output them from the register qw0. In the fourth cycle a new set of compressed data words are also read from the COQs in order to replenish the pipeline. Furthermore, whenever there is an engine drop out, the engine drop-out block will use its filters to produce twelve (12) consecutive compressed data words. The merger then writes these words into the compressor output register instead. Thus, through pre-fetch and pipelining, the merger is able to efficiently organize, store or transmit compressed data words.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A data compression system comprising:
   one or more compression engines executing in parallel for receiving uncompressed information words and compressing said information words into one or more compressed information words;
   a temporary storage queue associated with each compression engine for temporarily storing one or more compressed information words from its respective compression engine;
   a pre-fetch mechanism for pre-fetching an amount of compressed information words in parallel from each said temporary storage queue;
   a first processing device for receiving said pre-fetched compressed information words and successively forming a merged word in queue sequence order for output each processing cycle; and,
   a second processing device for receiving said pre-fetched compressed information words and generating a number of consecutive next available compressed words in queue sequence order when one or more temporary storage queues have exhausted its storage of compressed information words at any time during a processing cycle and, at such time, utilizing said number of consecutive next available compressed words to form said merged word output,
   whereby output of a complete merged word in each successive cycle is ensured.

2. The data compression system as claimed in claim 1, wherein said pre-fetch mechanism pre-fetches a greater amount of compressed information words needed to form said merged word during the cycle should one or more engines exhaust its supply of compressed words during said cycle.

3. The data compression system as claimed in claim 2, wherein said first and second processing devices operate synchronously.

4. The data compression system as claimed in claim 3, wherein said second processing device comprises:
   a mechanism for tracking an amount of compressed information words in each temporary storage queue; and,
   a mechanism for detecting the absence of remaining compressed information words in a temporary storage queue, and upon detection, said second processing unit collecting one or more consecutive next available compressed information words associated with next non-empty temporary storage queues in said queue sequence order for generating said number of consecutive next available compressed words.

5. The data compression system as claimed in claim 4, wherein said tracking mechanism maintains an associated word count indicating the amount of stored compressed words in a corresponding temporary storage queue, said word count being decremented when a compressed information word is output from a said corresponding temporary storage queue.

6. The data compression system as claimed in claim 3, wherein said first processing mechanism includes a number n of parallel pipeline registers corresponding to a number of temporary storage queues, each $i^{th}$ pipeline register having an input for directly receiving a prefetched compressed information word from each of n temporary storage queues in each processing cycle and every $n^{th}$ processing cycle thereafter, where i=0,1,2, . . . n−1, and where a $0^{th}$ register of said pipeline register receives said merged word output comprising n compressed information words for output each processing cycle.

7. The data compression system as claimed in claim 6, wherein each $0^{th}$ to $n-2^{th}$ pipeline register includes a pipeline input for receiving a merged word from an immediate prior pipeline register, each merged word at a register being pipelined to a successive register for output at said $0^{th}$ register at each processing cycle.

8. The data compression system as claimed in claim 6, wherein each $0^{th}$ to $n-1^{th}$ pipeline register includes a drop-out input for receiving a portion of said number of consecutive next available compressed words output from said second processing mechanism, said merger device further comprising:
   control device for selecting said portion of said number of consecutive next available compressed words output from said second processing device and inputting a selected portion to a suitable drop-out input for an $i^{th}$ register to form a complete merged word in queue sequence order for output at said $0^{th}$ register at a subsequent processing cycle, whereby continuous merged word output is ensured each successive cycle.

9. The data compression system as claimed in claim 8, wherein said control mechanism includes mechanism for back-filling a portion of said next available consecutive compressed words output from said second processing device with zeros (0's) when said next word output is less than a predetermined size.

10. A method for generating compressed data comprising the steps of:

a) inputting information words to one or more parallel executing compression engines and compressing said information words into one or more compressed information words;

b) temporarily storing one or more compressed information words in a temporary storage queue associated with each compression engine;

c) pre-fetching an amount of compressed information words in parallel from each said temporary storage queue;

d) merging one or more pre-fetched compressed information words to form a merged word in queue sequence order for output in a processing cycle; and, e) concurrently, tracking an amount of compressed information words in each temporary storage queue and, detecting exhaustion of supply of remaining compressed information words in a temporary storage queue; and, upon said detection, generating a number of consecutive next available compressed words from associated next non-empty temporary storage queues in said queue sequence order during a processing cycle; and, f) at such time when one or more temporary storage queues have exhausted its supply of compressed information words at any time during a processing cycle, utilizing said generated number of consecutive next available compressed words in said queue sequence order to form a complete merged word for output, whereby output of a complete merged word in each successive cycle is ensured.

11. The method for generating compressed data as claimed in claim 10, wherein said pre-fetching step includes pre-fetching a greater amount of compressed information words needed to form said merged word during the cycle should one or more engines exhaust its supply of compressed words during said cycle.

12. The method for generating compressed data as claimed in claim 11, wherein said tracking step e) includes the steps of:

maintaining an associated word count indicating the amount of stored compressed words in a corresponding temporary storage queue; and, decrementing said associated word count when a compressed information word is output from a corresponding temporary storage queue.

13. The method for generating compressed data as claimed in claim 10, further including the steps of:

determining a total word count corresponding to a total amount of compressed information words in each temporary storage queue; and, embedding said total word count in an associated first compressed information word from a temporary storage queue that is included in a complete merged word output, said embedded total word count facilitating later decompression of said complete merged word output.

* * * * *